(12) United States Patent
Darolia et al.

(10) Patent No.: US 6,982,126 B2
(45) Date of Patent: Jan. 3, 2006

(54) THERMAL BARRIER COATING

(75) Inventors: Ramgopal Darolia, West Chester, OH (US); Irene Spitsberg, Loveland, OH (US); Brett Allen Rohrer Boutwell, Liberty Township, OH (US); Mark Daniel Gorman, West Chester, OH (US); Curtis Alan Johnson, Niskayuna, NY (US); Venkat Subramaniam Venkataramani, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 2 days.

(21) Appl. No.: 10/707,197

(22) Filed: Nov. 26, 2003

(65) Prior Publication Data

US 2005/0112412 A1    May 26, 2005

(51) Int. Cl.
*B32B 9/00* (2006.01)
*F03B 3/12* (2006.01)

(52) U.S. Cl. .................. 428/701; 428/697; 428/699; 428/702; 428/632; 428/633; 428/141; 428/148; 416/241 B (58) Field of Classification Search .......... 428/697, 428/699, 701, 702, 632, 633, 141, 148; 416/241 B
See application file for complete search history.

(56) References Cited

U.S. PATENT DOCUMENTS

| | | | |
|---|---|---|---|
| 4,576,874 A | 3/1986 | Spengler et al. | |
| 4,774,150 A | 9/1988 | Amano et al. | |
| 4,916,022 A | 4/1990 | Solfest et al. | |
| 5,643,474 A | 7/1997 | Sangeeta | |
| 5,652,044 A | 7/1997 | Rickerby | |
| 5,683,825 A | 11/1997 | Bruce et al. | |
| 5,840,434 A | 11/1998 | Kojima et al. | |
| 5,876,860 A | 3/1999 | Marijnissen et al. | |
| 6,025,078 A | 2/2000 | Rickerby et al. | |
| 6,054,184 A | 4/2000 | Bruce et al. | |
| 6,103,386 A | 8/2000 | Raybould et al. | |
| 6,117,560 A | 9/2000 | Maloney | |
| 6,177,200 B1 | 1/2001 | Maloney | |
| 6,183,884 B1 * | 2/2001 | Rickerby | 428/623 |

(Continued)

FOREIGN PATENT DOCUMENTS

EP    1249515    10/2002

(Continued)

OTHER PUBLICATIONS

U.S. Appl. No. 10/063,962, filed May 30, 2002, Bruce.

(Continued)

*Primary Examiner*—Jennifer McNeil
(74) *Attorney, Agent, or Firm*—David L. Narciso; Gary M. Hartman; Domenica N. S. Hartman (57) ABSTRACT

A thermal barrier coating (TBC) for a component intended for use in a hostile thermal environment. The TBC has an interior region and an outer surface region on and contacting the interior region. Both regions are formed of a ceramic material, with the interior region having a lower thermal conductivity than zirconia partially stabilized by about seven weight percent yttria. The interior region constitutes more than half of the thickness of the TBC, and the outer surface region constitutes less than half of the thickness of the TBC. The TBC has a columnar microstructure whereby the interior region and the outer surface region comprise columns of their ceramic materials. The outer surface region is more erosion and impact resistant than the interior region at least in part as a result of the columns thereof being more closely spaced than the columns of the interior region.

26 Claims, 5 Drawing Sheets

U.S. PATENT DOCUMENTS

| | | |
|---|---|---|
| 6,203,927 B1 | 3/2001 | Subramanian et al. |
| 6,296,910 B1 | 10/2001 | Choy et al. |
| 6,352,788 B1 | 3/2002 | Bruce |
| 6,455,173 B1 | 9/2002 | Marijnissen et al. |
| 6,461,107 B1 | 10/2002 | Lee et al. |
| 6,485,590 B1 | 11/2002 | Ivkovich, Jr. et al. |
| 6,528,118 B2 | 3/2003 | Lee et al. |
| 6,558,814 B2 | 5/2003 | Spitsberg et al. |
| 6,586,115 B2 | 7/2003 | Rigney et al. |
| 6,599,568 B2 | 7/2003 | Lee et al. |
| 6,686,060 B2 | 2/2004 | Bruce |
| 6,689,487 B2 * | 2/2004 | Murphy ................. 428/632 |
| 2002/0110698 A1 | 8/2002 | Singh |
| 2003/0138658 A1 | 7/2003 | Taylor et al. |
| 2003/0215665 A1 | 11/2003 | Bruce et al. |

FOREIGN PATENT DOCUMENTS

| | | |
|---|---|---|
| EP | 1327704 | 7/2003 |
| EP | 1400611 | 3/2004 |

OTHER PUBLICATIONS

U.S. Appl. No. 10/064,939, filed Aug. 30, 2002, Bruce.

* cited by examiner

Type (2)

Figure 3

Type (1)

THERMAL BARRIER COATING

FEDERAL RESEARCH STATEMENT

This invention was made with Government support under Agreement No. N00421-00-3-0443 awarded by Naval Air Warfare Center Aircraft Division. The Government has certain rights in the invention.

BACKGROUND OF INVENTION

1. Field of the Invention

This invention generally relates to coatings for components exposed to high temperatures, such as the hostile thermal environment of a gas turbine engine. More particularly, this invention is directed to a thermal barrier coating (TBC) having a columnar microstructure, an interior region formed of a ceramic material with lower thermal conductivity than yttria-stabilized zirconia (YSZ), and an outer surface region that is more erosion-resistant than the interior region of the TBC.

2. Description of the Related Art

Components within the hot gas path of gas turbine engines are often protected by a thermal barrier coating (TBC). TBC's are typically formed of ceramic materials deposited by plasma spraying, flame spraying and physical vapor deposition (PVD) techniques. Spraying techniques deposit TBC material in the form of molten splats, resulting in a TBC characterized by a degree of inhomogeneity and porosity. TBC's employed in the highest temperature regions of gas turbine engines are most often deposited by PVD, particularly electron-beam PVD (EBPVD), which yields a strain-tolerant columnar grain structure that is able to expand and contract without causing damaging stresses that lead to spallation. Similar columnar microstructures can be produced using other atomic and molecular vapor processes, such as sputtering (e.g., high and low pressure, standard or collimated plume), ion plasma deposition, and all forms of melting and evaporation deposition processes (e.g., laser melting, etc.).

Various ceramic materials have been proposed as TBC's, the most widely used being zirconia ($ZrO_2$) partially or fully stabilized by yttria ($Y_2O_3$), magnesia (MgO), or ceria ($CeO_2$) to yield a tetragonal microstructure that resists phase changes. Other stabilizers have been proposed for zirconia, including hafnia ($HfO_2$) (U.S. Pat. No. 5,643,474 to Sangeeta), gadolinia ($Gd_2O_3$) (U.S. Pat. Nos. 6,177,200 and 6,284,323 to Maloney), and dysprosia ($Dy_2O_3$), erbia ($Er_2O_3$), neodymia ($Nd_2O_3$), samarium oxide ($Sm_2O_3$), and ytterbia ($Yb_2O_3$) (copending U.S. patent application Ser. No. 10/064,939). Yttria-stabilized zirconia (YSZ) has been the most widely used TBC material due at least in part to its high temperature capability, low thermal conductivity, and relative ease of deposition by plasma spraying, flame spraying and PVD techniques.

TBC materials that have lower thermal conductivities than YSZ offer a variety of advantages, including the ability to operate a gas turbine engine at higher temperatures, increased part durability, reduced parasitic cooling losses, and reduced part weight if a thinner TBC can be used. Commonly-assigned U.S. Pat. No. 6,586,115 to Rigney et al. discloses a YSZ TBC alloyed to contain an additional oxide that lowers the thermal conductivity of the base YSZ composition. These additional oxides include alkaline-earth metal oxides (magnesia, calcia (CaO), strontia (SrO) and barium oxide (BaO)), rare-earth metal oxides (ceria, gadolinia, neodymia, dysprosia and lanthana ($La_2O_3$)), and/or such metal oxides as nickel oxide (NiO), ferric oxide ($Fe_2O_3$), cobaltous oxide (CoO), and scandium oxide ($Sc_2O_3$). According to Rigney et al., when present in sufficient amounts these oxides are able to significantly reduce the thermal conductivity of YSZ by increasing crystallographic defects and/or lattice strains. Other ternary YSZ coating systems that have been proposed include YSZ+hafnia (commonly-assigned U.S. Pat. No. 6,352,788 to Bruce) and YSZ+niobia ($Nb_2O_3$) or titania ($TiO_2$) (commonly-assigned co-pending U.S. patent application Ser. No. 10/063,810 to Bruce et al.).

In addition to low thermal conductivities, TBC's on gas turbine engine components are required to withstand damage from impact by hard particles of varying sizes that are generated upstream in the engine or enter the high velocity gas stream through the air intake of a gas turbine engine. The result of impingement can be erosive wear (generally from smaller particles) or impact spallation from larger particles. Many of the oxides noted by Rigney et al. as able to reduce the thermal conductivity of YSZ have the disadvantage of also reducing erosion resistance. Above-noted U.S. Pat. No. 6,352,788 to Bruce teaches that YSZ containing about one up to less than six weight percent yttria in combination with magnesia and/or hafnia exhibits improved impact resistance. In addition, commonly-assigned U.S. patent application Ser. No. 10/063,962 to Bruce shows that small additions of lanthana, neodymia and/or tantala to zirconia partially stabilized by about four weight percent yttria (4% YSZ) can improve the impact and erosion resistance of 4% YSZ.

It would be desirable if improved TBC's were available that exhibited both lower thermal conductivities and improved erosion resistance.

SUMMARY OF INVENTION

The present invention generally provides a thermal barrier coating (TBC) for a component intended for use in a hostile thermal environment, such as the superalloy turbine, combustor and augmentor components of a gas turbine engine. The TBC has an interior region and an outer surface region on and contacting the interior region. Both regions are formed of a ceramic material, with the ceramic material of at least the interior region having a lower thermal conductivity than zirconia partially stabilized by about seven weight percent yttria, e.g., zirconia ($ZrO_2$) containing one or more of ytterbia ($Yb_2O_3$), neodymia ($Nd_2O_3$), lanthana ($La_2O_3$), hafnia ($HfO_2$), tantala ($Ta_2O_3$), gadolinia ($Gd_2O_3$), erbia ($Er_2O_3$), dysprosia ($Dy_2O_3$), and/or yttria ($YO_3$ ; e.g., more than 7 weight percent yttria if yttria is the only additive oxide). The interior region constitutes more than half of the thickness of the TBC, and the outer surface region constitutes less than half of the thickness of the TBC. The TBC has a columnar microstructure whereby the interior region and the outer surface region comprise columns of their ceramic materials. According to the invention, the outer surface region is more erosion and impact resistant than the interior region at least in part as a result of the columns thereof being more closely spaced than the columns of the interior region. In addition, the outer surface region may be formed to contain less porosity than the interior region.

As a result of the low thermal conductivity and relative thickness of the interior layer, the TBC preferably has a lower thermal conductivity than an equivalent columnar YSZ TBC while also exhibiting enhanced erosion and impact resistance as a result of the denser columnar construction of the outer surface region, which serves to protect the less erosion-resistant interior region. Accordingly, the TBC of this invention allows for the use of thinner coatings and/or lower cooling airflow for air-cooled components. Both regions of the TBC can be readily deposited by PVD techniques to have the more strain-resistant columnar grain structure noted above, with the closer column spacing of the outer surface region being achieved through compositional or processing modifications.

Other objects and advantages of this invention will be better appreciated from the following detailed description.

DETAILED DESCRIPTION

Figure 1:
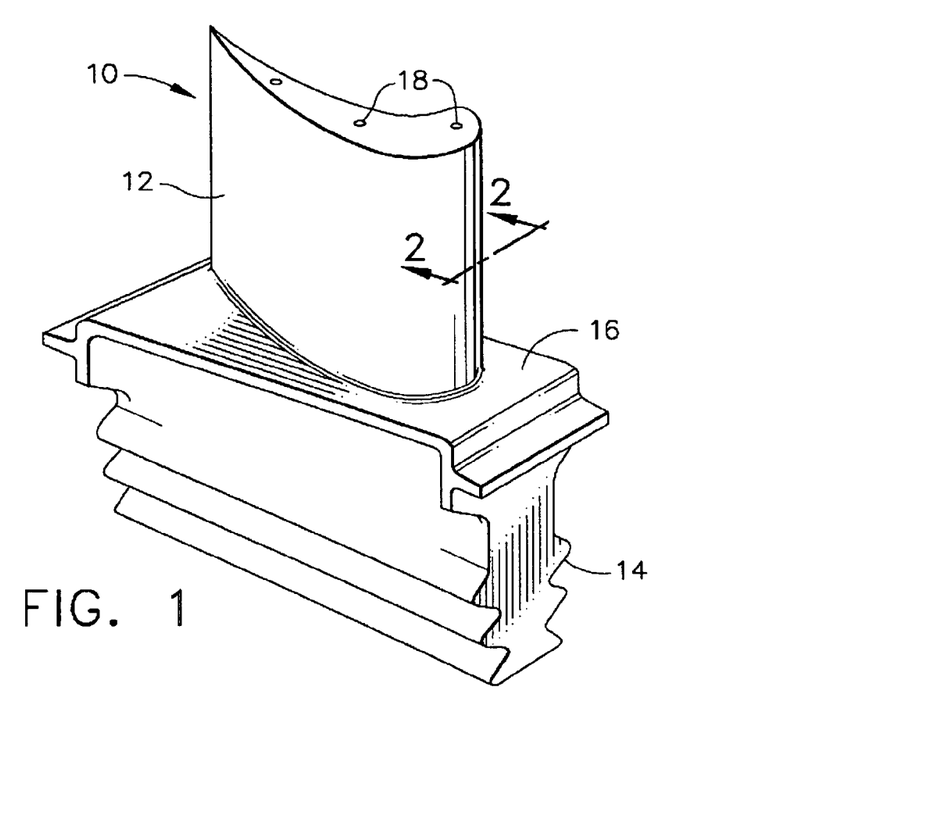
FIG. 1 is a perspective view of a high pressure turbine blade.

While the present invention is applicable to a variety of components subjected to high temperatures, such as the high and low pressure turbine nozzles and blades, shrouds, combustor liners and augmentor hardware of gas turbine engines, the invention will be discussed in reference to a high pressure turbine blade 10 shown in FIG. 1. The blade 10 generally includes an airfoil 12 against which hot combustion gases are directed during operation of the gas turbine engine, and whose surface is therefore subjected to hot combustion gases as well as attack by oxidation, corrosion and erosion. The airfoil 12 is protected from its hostile operating environment by a thermal barrier coating (TBC) system 20 schematically depicted in FIG. 2. The airfoil 12 is anchored to a turbine disk (not shown) with a dovetail 14 formed on a root section 16 of the blade 10. Cooling passages 18 are present in the airfoil 12 through which bleed air is forced to transfer heat from the blade 10.

Figure 2:
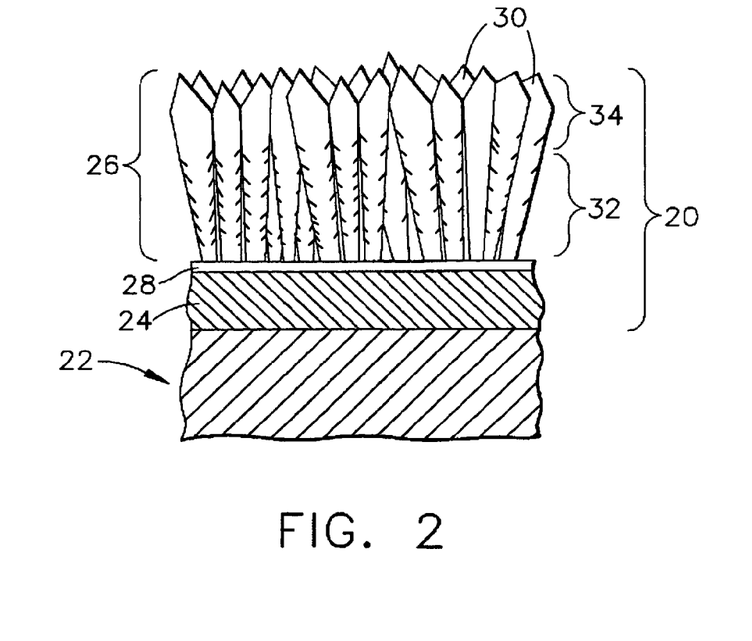
FIG. 2 schematically represents a cross-sectional view of the blade of FIG. 1 along line 2—2, and shows a thermal barrier coating system on the blade in accordance with a preferred embodiment of the invention.

The TBC system 20 is represented in FIG. 2 as including a ceramic TBC 26 anchored with a metallic bond coat 24 to the surface of a substrate 22, the latter of which is typically a superalloy and the base material of the blade 10. As is typical with TBC systems for components of gas turbine engines, the bond coat 24 is preferably an aluminum-rich composition of a type known in the art, such as an overlay coating of a beta-phase NiAl intermetallic or an MCrAlX alloy, or a diffusion coating such as a diffusion aluminide or a diffusion platinum aluminide. As such, the bond coat 24 develops an aluminum oxide (alumina) scale 28 as a result of oxidation, such as during deposition of the TBC 26 on the bond coat 24, as well as high temperature excursions of the blade 10 during engine operation. The alumina scale 28 chemically bonds the TBC 26 to the bond coat 24 and substrate 22. The TBC 26 is represented in FIG. 2 as having a strain-tolerant microstructure of columnar grains 30. As known in the art, such columnar microstructures can be achieved by depositing the TBC 26 using a physical vapor deposition technique, such as EBPVD or another atomic and molecular vapor process, as well as known melting and evaporation deposition processes. As with prior art TBC's, the TBC 26 is deposited to a thickness that is sufficient to provide the required thermal protection for the underlying substrate 22 and blade 10.

According to the invention, the TBC 26 has two regions: an interior region 32 and an outer surface region 34 (i.e., forming the outer surface of the TBC 26), as schematically represented in FIG. 2. The columnar grains 30 of the interior region 32 are represented as being more feathery and spaced farther apart than are the grains 30 within the outer surface region 34, with the result that the TBC 26 is more porous within the interior region 32 than at the outermost surface region 34 and, consequently, the outer surface region 34 is denser than the interior region 32. While the porous microstructure of the interior region 32 contributes to a lower thermal conductivity for the TBC 26, investigations reported below showed that this microstructure is not optimal for erosion and impact performance, particularly if the TBC 26 is formed of certain ceramic materials that result in a coating with a lower thermal conductivity than YSZ. According to these investigations, the more dense and more columnar microstructure of the outer surface region 34 exhibits improved erosion and impact resistance as compared to the microstructure of the interior region 32. By combining the microstructures of the interior and outer surface regions 32 and 34 into a single TBC 26, reduced thermal conductivity and improved erosion/impact resistance can be simultaneously achieved. It is believed that the interior region 32 should constitute at least half the thickness of the TBC 26, and preferably about 80% to 90% of the TBC 26, with the balance being the outer surface region 34. For example, for a TBC 26 having a thickness of about 5 mils (about 125 micrometers), a suitable thickness for the outer surface region 34 is about 1 mil (about 25 micrometers), while for a TBC 26 having a thickness of about 25 mils (about 635 micrometers), a suitable thickness for the outer surface region 34 is about 5 mils (about 125 micrometers). The interior and outer surface regions 32 and 34 are represented in FIG. 2 as being somewhat distinct, though the transition from the porous to denser microstructures can be more gradual, or can be more distinct as the result of being formed during separate coating operations.

To promote the thermal insulative properties of the TBC 26, at least the interior region 32 is preferably formed of a ceramic material having a lower thermal conductivity than the more conventional zirconia partially stabilized by about seven weight percent yttria (7% YSZ; thermal conductivity of about 1.6 to 2.0 W/mK at 900° C.). Preferred ceramic materials include zirconia containing one or more of ytterbia, neodymia, lanthana, and hafnia. When deposited by EBPVD to have a columnar grain structure, these ceramic materials have thermal conductivities of less than 1.4 W/mK, typically about 0.8 to 1.4 W/mK, as a result of the additive oxides contributing to one or more of three characteristics capable of reducing the thermal conductivity of a zirconia-based material: an atomic weight greater than that of zirconia, more preferably greater than that of yttria, to introduce phonon scattering sites and thereby reduces phonon free path to a greater extent than yttria; an atomic radius different than that of zirconia, more preferably greater than that of yttria, again to introduce phonon scattering; and a valance different than that of zirconia to introduce oxygen defects at a controlled level, providing another phonon scattering mechanism. Yttria can also be used as an additive oxide to zirconia for purposes of this invention, though preferably in amounts greater than 7 weight percent (for example, 20 weight percent) if it is the only additive oxide since the thermal conductivity of YSZ decreases with increasing yttria content. Effective amounts of ytterbia, yttria, neodymia, lanthana, and hafnia are believed to be, by weight, about 1% to about 65%, with additive oxide contents above about 50 weight percent yielding lowconductivity zirconia-based compounds such as pyrochlores, e.g., lanthanum zirconate. Tantala, gadolinia, erbia, and dysprosia, used alone, in any combination with each other, or in any combination with ytterbia, yttria, neodymia, lanthana, and/or hafnia, are also effective when present in an amount of about 1 to about 65 weight percent. Other oxide additives can also be used if they meet one or more of the above conditions, such as alkaline-earth metal oxides (e.g., MgO, CaO, SrO, BaO), other rare-earth metal oxides (e.g., $CeO_2$, $Sm_2O_3$), $Nb_2O_5$, NiO, $Fe_2O_3$, CoO, $Sc_2O_3$. etc. Preferably, yttria and ytterbia, neodymia, lanthana, hafnia, tantala, gadolinia, erbia, and/or dysprosia are present in a combined amount of about 7 to about 14 weight percent, with the balance essentially zirconia. Depending on the composition of the interior layer 32, an underlayer (not shown) formed of YSZ (e.g., 7% YSZ) and having a thickness of about 0.5 to about 2 mils (about 10 to about 50 micrometers) may be desirable to promote the adhesion of the TBC 26 to the substrate 22, thereby improving spallation resistance.

Various process and composition-related approaches can be used to obtain the different microstructures within the interior and outer surface regions 32 and 34 of the TBC 26, as will be discussed below. The compositions of the regions 32 and 34 may be identical (resulting in a constant composition throughout the TBC 26), have the same base composition but modified with certain additions, or have different base compositions. If the regions 32 and 34 have the same composition, processing modifications must be made to result in the denser microstructure desired for the outer surface region 34. If the regions 32 and 34 have the same base composition, minor chemistry modifications can be made to the outer surface region 34 to enhance surface diffusion processes and promote flatness of the crystallization front, causing a majority of the inter-columnar gaps to decrease during the deposition process. Examples of such chemistry modifications include additions of nickel, titanium, chromium, and/or their oxides to enhance sintering processes in zirconia during deposition of the outer surface region 34. Finally, if the interior and outer surface regions 32 and 34 are formed of different base compositions, the outer surface region 34 can be formed of a more erosion and impact-resistant ceramic material, such as YSZ and particularly in the range of about 4% YSZ to about 8% YSZ, whose microstructure can be densified by making appropriate processing modifications during deposition of the outer surface region 34.

In an investigation leading to this invention, YSZ TBC's having a nominal yttria content of about seven weight percent were deposited by EBPVD to have thicknesses of about 150 micrometers. Each of the TBC's were deposited on pin specimens formed of René N5 (nominal composition of, by weight, about 7.5% Co, 7.0% Cr, 6.5% Ta, 6.2% Al, 5.0% W, 3.0% Re, 1.5% Mo, 0.15% Hf, 0.05% C, 0.004% B, 0.01% Y, the balance nickel and incidental impurities), on which a platinum aluminide (PtAl) bond coat had been deposited. The microstructures of the TBC's differed from each other primarily as a result of modifications to the EBPVD process (e.g., deposition temperature, deposition pressure, rotation). The compositions of the TBC's were varied by small variations in the yttria content (about 4 to about 7 weight percent) and/or additions of small amounts (up to 5 weight percent) of ytterbia, lanthana, hafnia, or tantala. Twelve TBC's were deposited and analyzed for microstructure before and after undergoing impact and erosion testing. On the basis of this analysis, the TBC's were numerically assigned one of five types based on the columnarity and featheriness of the grain columns and the spacing between adjacent grain columns. The coating microstructures are summarized below in Table I.

TABLE I

| No. | Yttria (wt. %) | Third Oxide | Column Width | Feathery | Column Gaps | Microstructure Type (#-Decription) |
|---|---|---|---|---|---|---|
| 1 | 6 | 0 | Small | Minor | No | 1-Closed columns |
| 2 | 7 | 0 | Medium | Minor | Small | 2-Open columns |
| 3 | 7 | 0 | Medium | Yes | No | 1.5-Closed, feathery columns |
| 4 | 7 | 3.9 $La_2O_3$ | Small | Significant | Large | 4-Open feathers |
| 5 | 7 | 5.3 $La_2O_3$ + 1.7 $Ta_2O_5$ | Small | Significant | Large | 4-Open feathers |
| 6 | 7 | 5.0 $Yb_2O_3$ | Small | Significant | Large | 4-Open feathers |
| 7 | 7 | 3.4 $Yb_2O_3$ + 1.7 $Ta_2O_5$ | Medium | Significant | Medium to Large | 4-Open feathers |
| 8 | 4 | 1.8 to 2.4 $HfO_2$ | Medium | Significant | No | 3-Dense feathers |
| 9 | 4 | 0.1 to 3.9 $Ta_2O_5$ | Medium | Significant | No | 3-Dense feathers |
| 10 | 4 | 0 | Medium | Significant | Small | 3-Dense feathers |
| 11 | 6 | 5.0 $Yb_2O_3$ | Small | Minor | Segment | 2-Open columns |
| 12 | 6 | 5.0 $Yb_2O_3$ + C | Medium | Significant | Segment | 4-Open feathers |

Figure 3:
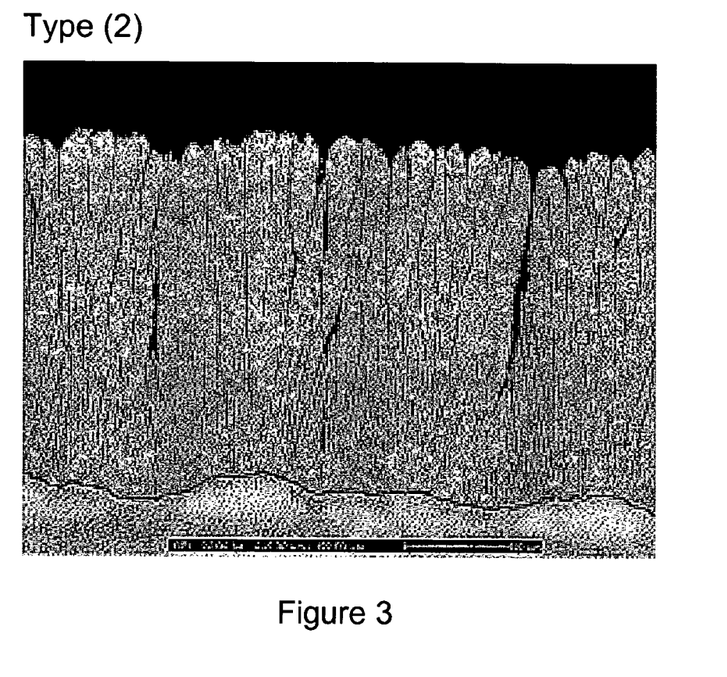
FIGS. 3 and 4 are scanned images showing cross-sections of thermal barrier coatings formed of 7% YSZ but having different levels of erosion/impact resistance as a result of having different columnar microstructures.
Figure 4:
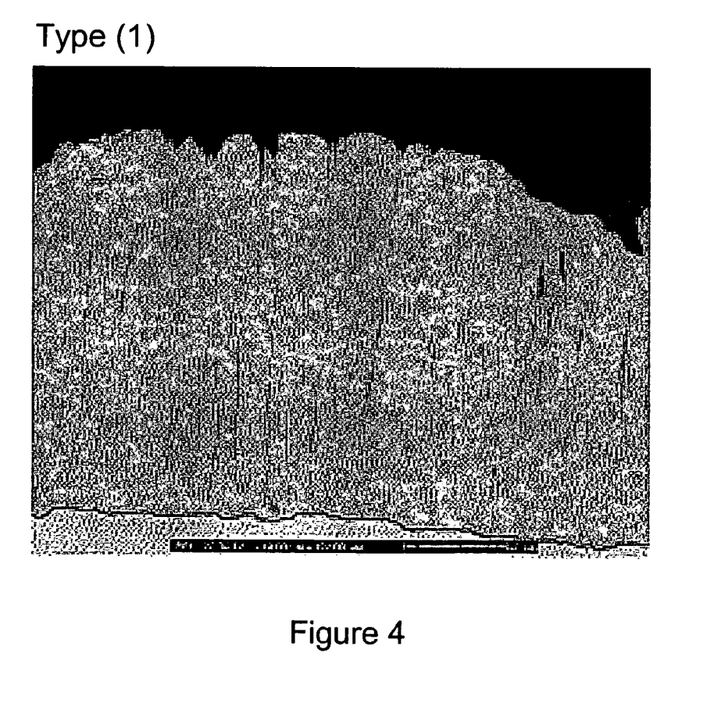

Scanned images of coatings 1 and 2 are shown in FIGS. 4 and 3, respectively, and illustrate the differences in what are termed "closed columns" and "open columns."

Impact and erosion tests were conducted on the specimens at high temperatures (about 1220° C.) and high gas velocities (about Mach 0.5) while subjected to a particulate material injected into the gas stream. An alumina powder with an average particle size of about 560 micrometers was used to evaluate impact resistance, while an alumina powder with an average particle size of about 50 micrometers was used to evaluate erosion resistance. The specimens were rotated at a rate of about 500 rpm while subjected to the high velocity powder. Both erosion and impact resistance were measured in terms of the number of grams of erodent required to wear away one mil (about 25 micrometers) of TBC. The results are reported in Table II below.

TABLE II

| Specimen (Coating) | Erosion (g/mil) min. | Erosion (g/mil) max. | Impact (g/mil) min. | Impact (g/mil) max. |
|---|---|---|---|---|
| 1 | 160 | 180 | 290 | 300 |
| 2 | 136 | 155 | 77 | 116 |
| 3 | 142 | 160 | 214 | 268 |
| 4 | 80 | 80 | 64 | 64 |
| 5 | 45 | 45 | 45 | 67 |
| 6 | 73 | 92 | 55 | 73 |
| 7 | 112 | 112 | 75 | 93 |
| 8 | 162 | — | 300 | — |
| 9 | 187 | — | 395 | — |
| 10 | — | Not tested | — | — |
| 11 | 107 | 125 | 89 | 107 |
| 12 | 100 | 100 | 50 | 50 |

Numerical analysis associating erosion and impact resistance with microstructure type showed that, when all coating characteristics were considered, dense coating microstructures with no gaps between columns (e.g., the closed columns of coating 1 shown in FIG. 4) typically resulted in better erosion and impact performance than more porous coating microstructures with gaps between columns (e.g., the open columns of coating 2 shown in FIG. 3). Notably, those coatings identified as having dense feathers (coatings 3, 8, and 9) also performed very well, indicating that spacing between columns was the most critical feature with respect to impact and erosion resistance. Also, the better-performing dense coating microstructures were obtained as a result of modifications to the EBPVD process, particularly temperatures of about 1000° C., pressures of less than five microbars, and rotation speeds of about four to six rpm. Though important, variations in yttria content and additions of a third oxide had a lesser affect on microstructure.

Figure 5:
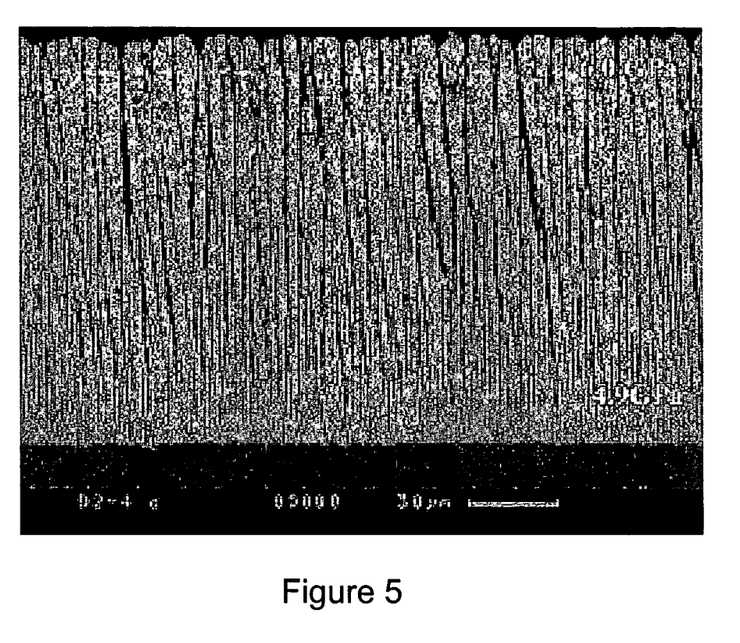
FIGS. 5 and 6 are scanned images showing a cross-section and a detailed portion thereof, respectively, of a thermal barrier coating formed of 7% YSZ and having a densified outer surface region for improved erosion/impact resistance in accordance with the present invention.
Figure 6:
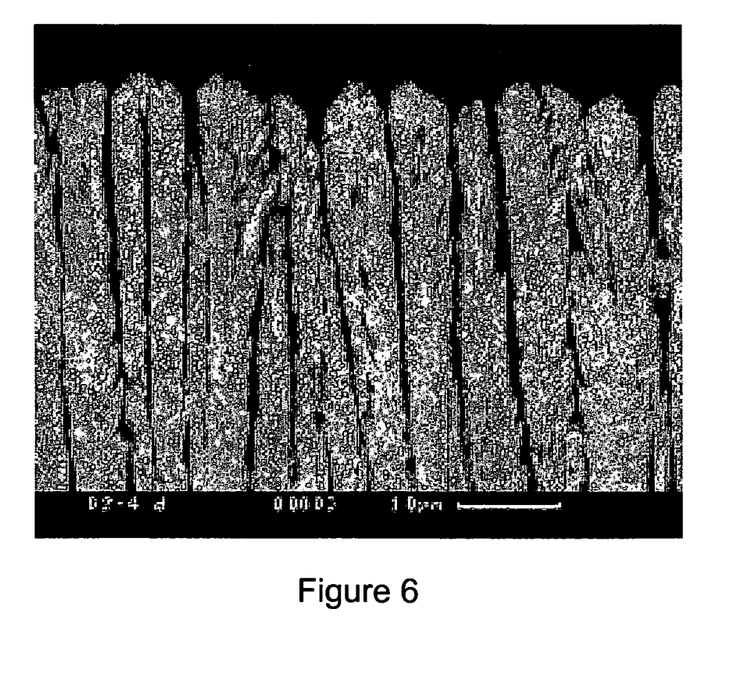
Figure 7:
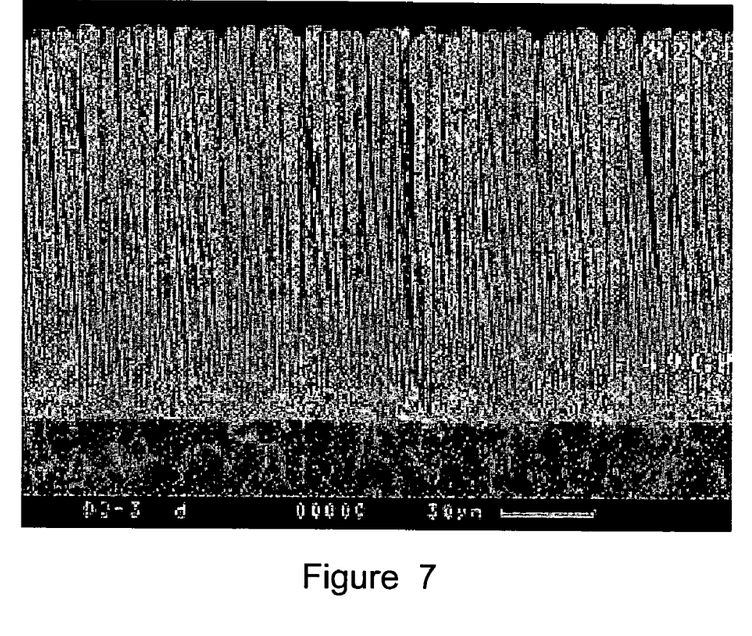
FIGS. 7 and 8 are scanned images showing a cross-section and a detailed portion thereof, respectively, of a thermal barrier coating formed of 7% YSZ, wherein the coating is characterized by improved erosion/impact resistance over the coating of FIGS. 5 and 6 as a result of having a denser and harder outer surface region in accordance with the present invention.
Figure 8:
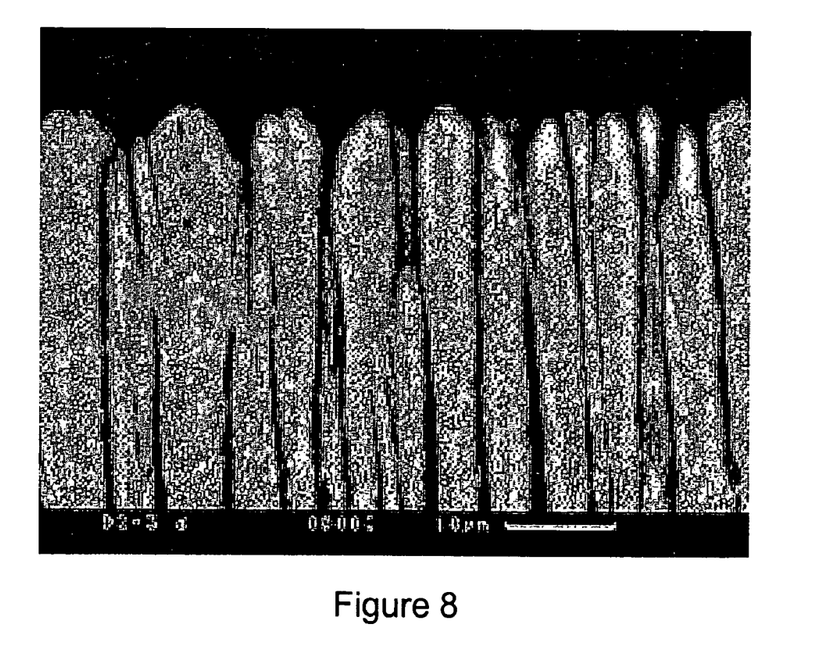
Figure 9:
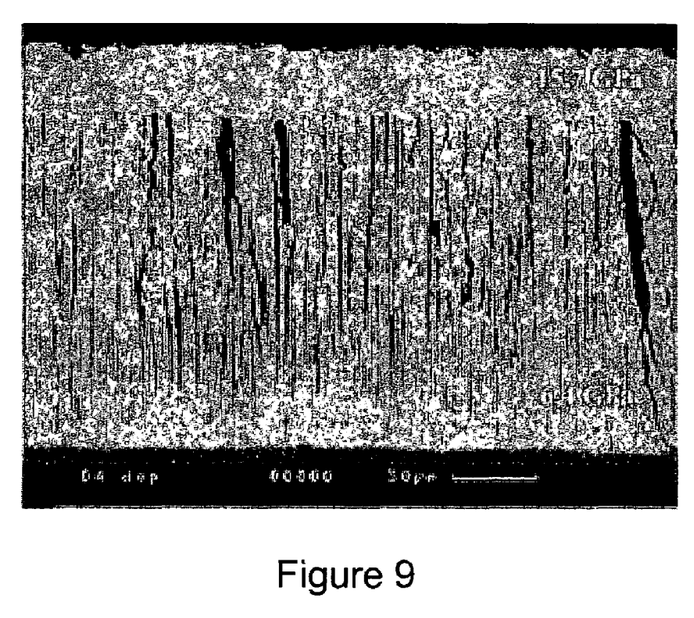
FIGS. 9 and 10 are scanned images showing a cross-section and a detailed portion thereof, respectively, of a thermal barrier coating formed of 7% YSZ and having a fully dense outer surface region in accordance with an optional aspect of the present invention.
Figure 10:
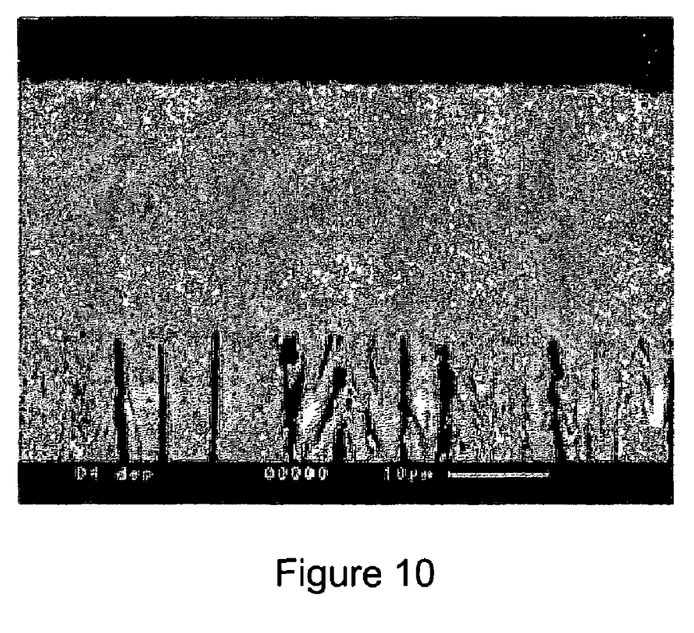

In a second investigation, the extent to which EBPVD deposition temperature can be used to control coating microstructure was assessed with YSZ TBC's having a nominal yttria content of about seven weight percent. The coatings were again deposited by EBPVD to have thicknesses of about 150 micrometers. Each coating was deposited on a pin specimen formed of René N5, on which a PtAl bond coat had been deposited. The microstructures of the outer surface regions of the TBC's were modified relative to the interior regions of the coatings by increasing the power of the electron beam while depositing the final twenty-five micrometers of the coatings. The electron beam power was held at about 2.5 kW during deposition of the interior coating regions, after which power was periodically increased in either five-second pulses to about 18 to 20 kW or ten-second impulses to about 15 to 16 kW (and therefore lower power but higher energy). FIGS. 5 and 6 are scanned images of a coating whose outer surface region was deposited with the ten-second pulse technique, while FIGS. 7 and 8 are scanned images of a coating whose outer surface region was deposited with the five-second pulse technique. From FIGS. 5 through 8 (in which FIGS. 6 and 8 are magnified regions of the coatings shown in FIGS. 5 and 7, respectively), it can be seen that the coating deposited with higher electron beam energy (FIGS. 7 and 8) resulted in a more columnar and denser grain structure, while the coating deposited with lower electron beam energy (FIGS. 5 and 6) was not as columnar and had more widely-spaced feathery grains resulting in a more porous microstructure. FIGS. 9 and 10 show scanned images of another coating specimen deposited in the same manner, but with the final electron beam power increased in 10 second impulses to about 24 kW. From FIGS. 9 and 10, it is evident that the outer surface region (again, about 25 micrometers in thickness) of this coating specimen was fully densified as a result of the higher electron beam power.

The hardness of each coating was measured using a Vickers pyramid with a fifty gram load. Hardness readings indicated that the interior regions of all coatings had hardness readings on the order of about 3 to 5.2 GPa. Those coatings with dense columnar microstructures represented by FIGS. 7 and 8 had hardness readings on the order of about 6 to 7 GPa, while those with the more porous microstructure represented by FIGS. 5 and 6 had hardness readings similar to the readings for the interior regions of the coatings. Consequently, it is believed that coatings having dense columnar microstructures preferred by this invention for the outer surface region 34 can be identified by hardness testing.

In addition to process changes, selective densification of the outer surface region 34 can be achieved by adding small amounts of nickel, titanium, chromium, and/or their oxides, which are known to enhance sintering processes in zirconia. Suitable amounts of these additives are believed to be on the order of about 1 to about 2 weight percent of the TBC material.

The above investigations were conducted with YSZ TBC to characterize the types of coating microstructure associated with improved erosion and impact resistance. Lower thermal conductivities sought by this invention can be achieved by substituting a low thermal conductivity ceramic material for YSZ within the interior region of the TBC. From the results obtained with YSZ coatings, it was concluded that improvements in erosion and impact resistance can be achieved with a denser columnar microstructure at the outer surface region of the TBC, regardless of the ceramic material used, including those ceramic materials known to have lower thermal conductivities but also lower erosion/impact resistance than YSZ. With this approach, the lower thermal conductivities and improved erosion/impact resistance sought by this invention can be simultaneously achieved by using a low thermal conductivity ceramic material throughout the TBC.

While the invention has been described in terms of a preferred embodiment, it is apparent that other forms could be adopted by one skilled in the art. Accordingly, the scope of the invention is to be limited only by the following claims.

What is claimed is:

1. A thermal barrier coating on a surface of a component, the thermal barrier coating having an interior region formed of a ceramic material so as to have a lower thermal conductivity than zirconia partially stabilized by about seven weight percent yttria, and an outer surface region on and contacting the interior region and formed of a ceramic material, the thermal barrier coating having a columnar microstructure whereby the interior region and the outer surface region comprise columnar grains of their ceramic materials, the grains of the interior region and the outer surface region being oriented substantially normal to the surface of the component, at least a portion of the columnar microstructure comprising feathery grains, the grains of the outer surface region being denser, more columnar, and more closely spaced than the grains of the interior region, the outer surface region being more erosion and impact resistant than the interior region at least in part as a result of the grains thereof being more closely spaced than the grains of the interior region.

2. A thermal barrier coating according to claim 1, wherein the ceramic materials of the interior region and the outer surface region have the same composition.

3. A thermal barrier coating according to claim 1, wherein the thermal barrier coating consists essentially of zirconia and at least one of ytterbia, yttria, neodymia, lanthana, hafnia, tantala, gadolinia, erbia, and dysprosia.

4. A thermal barrier coating according to claim 3, wherein the ceramic materials of the interior region and the outer surface region have the same composition.

5. A thermal barrier coating according to claim 1, wherein the thermal barrier coating consists essentially of zirconia, yttria, and at least one of ytterbia, neodymia, lanthana, hafnia, tantala, gadolinia, erbia, and dysprosia.

6. A thermal barrier coating according to claim 5, wherein the ceramic materials of the interior region and the outer surface region have the same composition.

7. A thermal barrier coating according to claim 1, wherein the ceramic materials of the interior region and the outer surface region do not have the same composition.

8. A thermal barrier coating according to claim 7, wherein the outer surface region contains at least one of nickel, titanium, chromium, and oxides thereof, and the interior region is substantially free of nickel, titanium, chromium, and oxides thereof.

9. A thermal barrier coating according to claim 1, wherein the interior region of the thermal barrier coating consists essentially of zirconia and at least one of ytterbia, yttria, neodymia, lanthana, hafnia, tantala, gadolinia, erbia, and dysprosia, and wherein the outer surface region consists essentially of zirconia partially stabilized by yttria, whereby the ceramic materials of the interior region and the outer surface region do not have the same composition.

10. A thermal barrier coating according to claim 9, wherein the outer surface region consists essentially of zirconia stabilized by about four to about eight weight percent yttria.

11. A thermal barrier coating according to claim 1, wherein the interior region of the thermal barrier coating consists essentially of zirconia, yttria, and at least one of ytterbia, neodymia, lanthana, hafnia, tantala, gadolinia, erbia, and dysprosia, and wherein the outer surface region consists essentially of zirconia partially stabilized by yttria, whereby the ceramic materials of the interior region and the outer surface region do not have the same composition.

12. A thermal barrier coating according to claim 11, wherein the outer surface region consists essentially of zirconia partially stabilized by about four to about eight weight percent yttria.

13. A thermal barrier coating according to claim 1, wherein the outer surface region has a hardness of at least 6 GPa as measured by the Vickers pyramid with a fifty-gram load.

14. A thermal barrier coating according to claim 1, wherein the interior region and the outer surface region are discrete layers separated by a distinct interface.

15. A thermal barrier coating according to claim 1, wherein the interior region and the outer surface region are not discrete layers and are not separated by a distinct interface.

16. A thermal barrier coating according to claim 1, wherein the interior region and the outer surface region comprise feathery grains, the grains of the interior region are more feathery than the grains of the outer surface region, and the feathery grains of the outer surface region are denser and less porous than the feathery grains of the interior region.

17. A thermal barrier coating according to claim 1, wherein the outer surface region does not contain feathery grains.

18. A thermal barrier coating on a surface of a gas turbine engine component, the thermal barrier coating having an interior region and an outer surface region on and contacting the interior region, the interior region and the outer surface region being discrete ceramic layers separated by a distinct interface, the interior region consisting essentially of zirconia and at least one of ytterbia, yttria, neodymia, lanthana, hafnia, tantala, gadolinia, erbia, and dysprosia, the thermal barrier coating having a columnar microstructure whereby the interior region and the outer surface region comprise columnar grains, at least a portion of the columnar microstructure comprising feathery grains, the grains of the outer surface region being denser, more columnar and more closely spaced than the grains of the interior region, the outer surface region being more erosion and impact resistant than the interior region at least in part as a result of the grains thereof being more closely spaced than the grains of the interior region.

19. A thermal barrier coating according to claim 18, wherein the interior region and the outer surface region have the same composition.

20. A thermal barrier coating according to claim 19, wherein the composition of the interior region and the outer surface region is zirconia containing about 1 to about 65 weight percent of at least one additive oxide chosen from the group consisting of ytterbia, yttria, neodymia, lanthana, hafnia, tantala, gadolinia, erbia, and dysprosia.

21. A thermal barrier coating according to claim 18, wherein the interior region and the outer surface region do not have the same composition.

22. A thermal barrier coating according to claim 21, wherein the outer surface region consists essentially of zirconia partially stabilized by about 4 to about 8 weight percent yttria.

23. A thermal barrier coating according to claim 18, wherein the grains of the interior region and the outer surface region are oriented substantially normal to the surface of the component.

24. A thermal barrier coating according to claim 18, wherein the interior region and the outer surface region comprise feathery grains, the grains of the interior region are more feathery than the grains of the outer surface region, and the feathery grains of the outer surface region are denser and less porous than the feathery grains of the interior region.

25. A thermal barrier coating according to claim 18, wherein the outer surface region does not contain feathery grains.

26. A thermal barrier coating on a surface of a component, the thermal barrier coating having an interior region formed of a ceramic material so as to have a lower thermal conductivity than zirconia partially stabilized by about seven weight percent yttria, and an outer surface region on and contacting the interior region and formed of a ceramic material that has a different composition than the ceramic materials of the interior region, the interior region constituting more than half of the thickness of the thermal barrier coating and the outer surface region constituting less than half of the thickness of the thermal barrier coating, the thermal barrier coating having a columnar microstructure whereby the interior region and the outer surface region comprise columns of their ceramic materials, the columns of the outer surface region being more closely spaced than the columns of the interior region, the outer surface region being more erosion and impact resistant than the interior region at least in part as a result of the columns thereof being more closely spaced than the columns of the interior region.

* * * * *